US012507544B2

(12) United States Patent
Niu et al.

(10) Patent No.: US 12,507,544 B2
(45) Date of Patent: Dec. 23, 2025

(54) DISPLAY PANEL INCLUDING FIRST DUMMY CONDUCTIVE PATTERNS BETWEEN TWO ADJACENT DATA CONNECTION LINES

(71) Applicant: Wuhan China Star Optoelectronics Semiconductor Display Technology Co., Ltd., Hubei (CN)

(72) Inventors: Yanfen Niu, Hubei (CN); Ruifang Wang, Hubei (CN); Yong Chen, Hubei (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 26 days.

(21) Appl. No.: 17/781,128

(22) PCT Filed: May 23, 2022

(86) PCT No.: PCT/CN2022/094374
§ 371 (c)(1),
(2) Date: May 31, 2022

(87) PCT Pub. No.: WO2023/201830
PCT Pub. Date: Oct. 26, 2023

(65) Prior Publication Data
US 2024/0188352 A1 Jun. 6, 2024

(30) Foreign Application Priority Data

Apr. 20, 2022 (CN) .......................... 202210418678.6

(51) Int. Cl.
*H10K 59/131* (2023.01)
*H10K 59/121* (2023.01)

(52) U.S. Cl.
CPC ....... *H10K 59/131* (2023.02); *H10K 59/1213* (2023.02)

(58) Field of Classification Search
CPC ..................... H10K 59/131; H10K 59/1213
(Continued)

(56) References Cited

U.S. PATENT DOCUMENTS 9,638,949 B1 * 5/2017 Kim .................... G06F 3/04164
10,539,837 B2 1/2020 Wang
(Continued)

FOREIGN PATENT DOCUMENTS

CN 106094359 11/2016
CN 106601712 4/2017
(Continued)

OTHER PUBLICATIONS

International Search Report and the Written Opinion Dated Dec. 16, 2022 From the International Searching Authority Re. Application No. PCT/CN2022/094374 and Its Translation Into English. (19 Pages).
(Continued)

*Primary Examiner* — Sheng-Bai Zhu (57) ABSTRACT

A display panel and a display device are disclosed by the present disclosure. The display panel comprises an aperture area and a display area. The display area includes a first display area and a second display area, the first display area is provided with a plurality of data connection lines, and each of the data connection lines is connected to two data lines extending along a same direction and located on both sides of the aperture area. The first display area is further provided with a plurality of first dummy conductive patterns, and the plurality of first dummy conductive patterns are evenly distributed in a gap area between two adjacent ones of the data connection lines.

20 Claims, 5 Drawing Sheets

(58) Field of Classification Search
USPC .......................................................... 257/40
See application file for complete search history.

(56) References Cited

U.S. PATENT DOCUMENTS

| | | | | |
|---|---|---|---|---|
| 2002/0047977 | A1* | 4/2002 | Lee | G02F 1/136259 |
| | | | | 349/141 |
| 2006/0279690 | A1* | 12/2006 | Yu | G02F 1/13338 |
| | | | | 349/199 |
| 2013/0207099 | A1* | 8/2013 | Shu | H10K 59/1213 |
| | | | | 257/43 |
| 2015/0378228 | A1 | 12/2015 | Qin | |
| 2017/0154566 | A1* | 6/2017 | Ryoo | H10K 59/131 |
| 2018/0151834 | A1* | 5/2018 | Kanaya | H10D 30/673 |
| 2020/0363670 | A1* | 11/2020 | Shiina | G09F 9/30 |
| 2021/0035496 | A1* | 2/2021 | Cho | H10K 59/131 |
| 2021/0241671 | A1* | 8/2021 | Lee | G09G 3/2003 |
| 2021/0320163 | A1* | 10/2021 | Bang | H10K 59/131 |
| 2021/0391405 | A1* | 12/2021 | Lee | H10K 59/124 |
| 2022/0005886 | A1* | 1/2022 | Jeong | H10K 59/131 |
| 2024/0315109 | A1* | 9/2024 | Zhou | H01L 25/0753 |

FOREIGN PATENT DOCUMENTS

| | | | |
|---|---|---|---|
| CN | 108735094 | * | 11/2018 |
| CN | 110070820 | | 7/2019 |
| CN | 110767714 | | 2/2020 |
| CN | 111710257 | | 9/2020 |
| CN | 111951687 | | 11/2020 |
| CN | 112885876 | | 6/2021 |
| CN | 113707092 | | 11/2021 |
| CN | 215896403 | | 2/2022 |
| CN | 114300509 | | 4/2022 |
| DE | 102020118212 | * | 2/2021 |
| JP | 2008-146051 | | 6/2008 |
| JP | 2019-144589 | | 8/2019 |
| WO | WO 2020/019415 | | 1/2020 |
| WO | WO 2020/192024 | | 10/2020 |

OTHER PUBLICATIONS

Notification of Office Action and Search Report Dated May 11, 2024 From The State Intellectual Property Office of the People's Republic of China Re. Application No. 202210418678.6 and Its Translation Into English. (15 Pages).

* cited by examiner

DISPLAY PANEL INCLUDING FIRST DUMMY CONDUCTIVE PATTERNS BETWEEN TWO ADJACENT DATA CONNECTION LINES

RELATED APPLICATIONS

This application is a National Phase of PCT Patent Application No. PCT/CN2022/094374 having International filing date of May 23, 2022, which claims the benefit of priority of Chinese Patent Application No. 202210418678.6 filed on Apr. 20, 2022. The contents of the above applications are all incorporated by reference as if fully set forth herein in their entirety.

FIELD AND BACKGROUND OF THE INVENTION

The present disclosure relates to the field of display technologies, and in particular to a display panel and display device.

An active matrix organic light emitting diode (AMOLED) display panel has gradually replaced liquid crystal display (LCD) as a new generation of display technology because of its advantages of high contrast, wide color gamut, and low power consumption.

Figure 1:
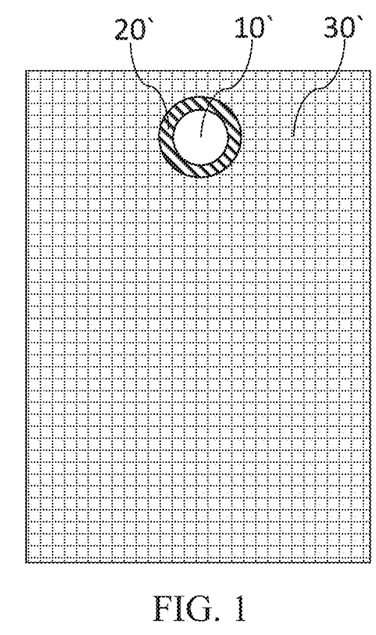
FIG. 1 a schematic plan view of a hole-display in the prior art.

With the continuous development of display technologies, narrow frame technologies have gradually become a highlight technology to attract users. As shown in FIG. 1, in the hole display (O-Cut), as one of the narrow frame technologies, a screen-to-body ratio is increased by configuring an aperture area 10' in the display panel, and configuring a camera on a position corresponding to the aperture area 10'. In the hole display, a transition area 20' is further disposed between the aperture area 10' and the display area 30'. The transition region 20' needs to be provided with a packaging structure to isolate water and oxygen, and a data winding to connect data lines on the upper and lower sides of the aperture area 10', which render a dense and complex line design of the transition area 20'. In addition, it is difficult for an overall width to be adjusted to be narrow, resulting in a large black edge area between the display area 30' and the aperture area 10'.

In order to reduce the width of the transition area 20', researchers developed a display structure in which the data winding is configured to the display area 30'. However, in the display structure, the pattern design of the data winding is quite regular. In a screen-on state of the display panel, the diffraction grating phenomenon occurs, resulting in uneven brightness of the area where the data winding is located in the screen-on state, i.e., the mura known in the industry, seriously affecting the display quality. This problem needs to be solved urgently.

SUMMARY OF THE INVENTION

The present disclosure provides a display panel and a display device, which can effectively improve uneven brightness of an area where the data winding is located in a screen-on state, thereby improving display quality.

In order to solve the above problems, the technical solutions provided by the display panel and the display device of present disclosure are as follows:

In one aspect, the present disclosure provides a display panel, comprising: an aperture area and a display area surrounding the aperture area, wherein the display area includes a first display area and a second display area surrounding the first display area, the first display area is provided with a plurality of data connection lines, and each of the data connection lines is connected to two data lines extending along a same direction and located on both sides of the aperture area;
wherein the first display area is further provided with a plurality of first dummy conductive patterns, and the plurality of first dummy conductive patterns are evenly distributed in a gap area between two adjacent ones of the data connection lines.

Optionally, the first display area includes a plurality of first pixel areas disposed in an array, and a first combined pattern formed by each of the data connection lines and each of the first dummy conductive patterns is defined by each of the first pixel areas to form a plurality of first sub-patterns; wherein the second display area includes a plurality of second pixel areas disposed in an array, the display panel further comprises a plurality of second dummy conductive patterns disposed in an array in the second display area, and a second combined pattern formed by each of the second dummy conductive patterns is defined by each of the second pixel areas to form a plurality of second sub-patterns; wherein each of the second pixel areas is defined by intersection of two adjacent ones of the data lines and two adjacent scan lines, a shape and an area of the first pixel area are the same as a shape and an area of the second pixel area, and a pattern similarity between the first sub-pattern and the second sub-pattern is greater than or equal to 70%.

Optionally, each of the first dummy conductive patterns has a first voltage, each of the second dummy conductive patterns has a second voltage, and the first voltage is equal to the second voltage.

Optionally, the display panel further comprises a VDD signal line, and each of the first dummy conductive patterns and each of the second dummy conductive patterns are both electrically connected to the VDD signal line.

Optionally, the first dummy conductive patterns and the second dummy conductive patterns are disposed in the same layer as the data connection lines.

Optionally, the display area is provided with a first transparent conductive layer, and the first dummy conductive patterns, the second dummy conductive patterns, and the data connection lines are formed by patterning the first transparent conductive layer.

Optionally, a plurality of thin film transistors and a plurality of pixel units are disposed in an array in the display area, the plurality of thin film transistors are located under the first transparent conductive layer and include a source and a drain; and the plurality of pixel units are located on the first transparent conductive layer and include an anode;
wherein the first transparent conductive layer further includes a plurality of switching wires located in the first display area and the second display area, and the switching wires are respectively electrically connected to the anode and the drain through via holes; wherein the first dummy conductive patterns and the second dummy conductive patterns are both disposed at intervals from the switching wires.

Optionally, in the first display area, a minimum distance between each of the first dummy conductive patterns and the adjacent switching wires is greater than or equal to 3 μm, and a minimum distance between each of the first dummy conductive patterns and the adjacent data connection lines is greater than or equal to 3 μm.

Optionally, the display area is further provided with a second transparent conductive layer, and the second transparent conductive layer is located between the thin film transistor and the first transparent conductive layer, wherein the second transparent conductive layer includes a patterned structure electrically connected to the VDD signal line, and the first dummy conductive patterns and the second dummy conductive patterns are respectively electrically connected to the patterned structure through via holes.

Optionally, each of the data connection lines includes a first fold line part, a second fold line part, and a third fold line part which are connected in sequence, and the second fold line part is respectively perpendicular to the first fold line part and the third fold line part.

On the other hand, the present disclosure further provides a display device, including an optical element and the display panel described in any one of the above, wherein the display panel comprises a display side and a non-display side, and the optical element is disposed on the non-display side of the display panel, and is disposed corresponding to the aperture area.

The present disclosure provides a display panel and a display device. In the present disclosure, the plurality of first dummy conductive patterns are evenly disposed in the gap area between adjacent data connection lines, so that slits between adjacent data connection lines are irregular, thereby reducing diffraction grating phenomenon caused by a regular arrangement of the data connection lines, and reducing the probability of the mura problem of the display panel in a screen-on state, so as to improve the display quality.

BRIEF DESCRIPTION OF THE SEVERAL VIEWS OF THE DRAWINGS

In order to illustrate the technical solutions of the present disclosure clearly, the drawings desired for embodiments will be described hereinafter briefly. Obviously, the following drawings merely relate to some embodiments of the present disclosure, and based on these drawings, a person skilled in the art may obtain the other drawings without any creative effort.

DESCRIPTION OF SPECIFIC EMBODIMENTS OF THE INVENTION

The technical solutions in the embodiments of the present disclosure are clearly and completely described below with reference to the drawings in the embodiments of the present disclosure. Obviously, the described embodiments are only a part of the embodiments of the present disclosure, rather than all the embodiments. Based on the embodiments in present disclosure, all other embodiments obtained by those skilled in the art without creative efforts shall fall within the protection scope of the present disclosure. In addition, it should be understood that the specific embodiments described herein are only used to illustrate and explain the present disclosure, but not to limit the present disclosure. In the present disclosure, unless otherwise stated, the directional terms used such as "upper" and "lower" generally refer to the upper and lower sides of the device in actual use or working state, specifically the drawing direction in the accompanying drawings while the terms "inside" and "outside" refer to the outline of the device.

The following disclosure provides many different embodiments or examples for implementing different structures of the present disclosure. To simplify the present disclosure, the components and configurations of specific examples are described below, which are merely examples and are not intended to limit the present disclosure. Furthermore, in the present disclosure, reference numerals and/or reference letters may be repeated in different examples for simplicity and clarity. Such repeat does not indicate a relationship between the various embodiments and/or configurations discussed herein. In addition, examples of various specific processes and materials are provided in the present disclosure. However, one of ordinary skill in the art can recognize applications of other processes and/or uses of other materials. The following detailed descriptions are provided respectively. It should be noted that the description order of the following embodiments is not intended to limit the preferred order of the embodiments.

The present disclosure provides a display panel, comprising an aperture area and a display area surrounding the aperture area. The display area includes a first display area and a second display area surrounding the first display area, the first display area is provided with a plurality of data connection lines, and each of the data connection lines is connected to two data lines extending along a same direction and located on both sides of the aperture area. The first display area is further provided with a plurality of first dummy conductive patterns, and the plurality of first dummy conductive patterns are evenly distributed in a gap area between two adjacent ones of the data connection lines.

In the present disclosure, the plurality of first dummy conductive patterns are evenly disposed in the gap area between adjacent data connection lines (i.e., data winding), so that slits between adjacent data connection lines are irregular, so as to reduce an area of the slit, thereby reducing diffraction grating phenomenon caused by a regular arrangement of the data connection lines, and reducing the probability of the mura problem of the display panel in a screen-on state, so as to improve the display quality.

Figure 2:
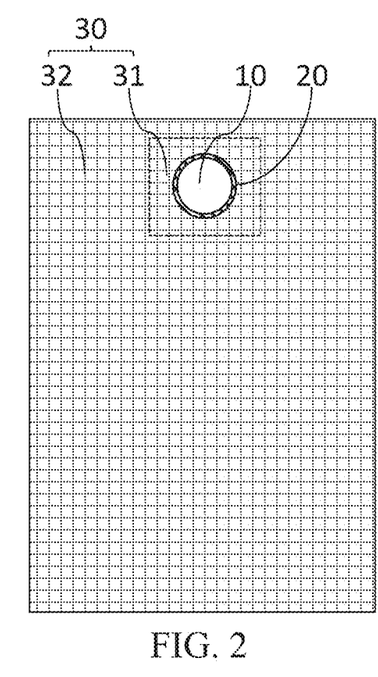
FIG. 2 is a schematic plan view of a display panel provided by an embodiment of the present disclosure.

Specifically, FIG. 2 is a schematic plan view of a display panel provided by an embodiment of the present disclosure. As shown in FIG. 2, the display panel is, for example, an AMOLED display panel, and the display panel includes an aperture area 10, a transition area 20 surrounding the aperture area 10, and a display area 30 surrounding the transition area 20. Certainly, the type of the display panel is not limited herein. The display panel may further be a liquid crystal display panel, a QLED display panel, or the like.

In the embodiment, the display panel includes a display side and a non-display side, and there is a through hole or a blind hole in the aperture area 10. The through hole or the blind hole is used to realize the function of light transmission, so that the ambient light can pass through the aperture area 10 from the display side of the display panel with high efficiency, so as to reach the non-display side of the display panel. Correspondingly, in the complete device, an optical element may be disposed on the non-display side of the display panel, and the optical element may be disposed corresponding to the opening area 10, so that a better photosensitive function is achieved by the optical element.

In the embodiment, the transition area 20 is used for configuring a packaging structure to prevent external water and oxygen from entering the display area 30 from the aperture area 10, which may affect the display quality of the display panel.

In the embodiment, the display area 30 includes a first display area 31 and a second display area 32 surrounding the first display area 31, both of which are provided with pixel units arranged in an array, and the pixel units are used to realize a display function. Specifically, the first display area 31 includes a plurality of first pixel areas, and the pixel units of the first display area 31 are correspondingly disposed on each of the first pixel areas. The second display area 32 includes a plurality of second pixel areas, and the pixel units of the second display area 32 are correspondingly disposed on each of the second pixel areas.

In the embodiment, the display panel may further include a non-display area, and the non-display area may surround an outer side of the display area 30.

Figure 3:
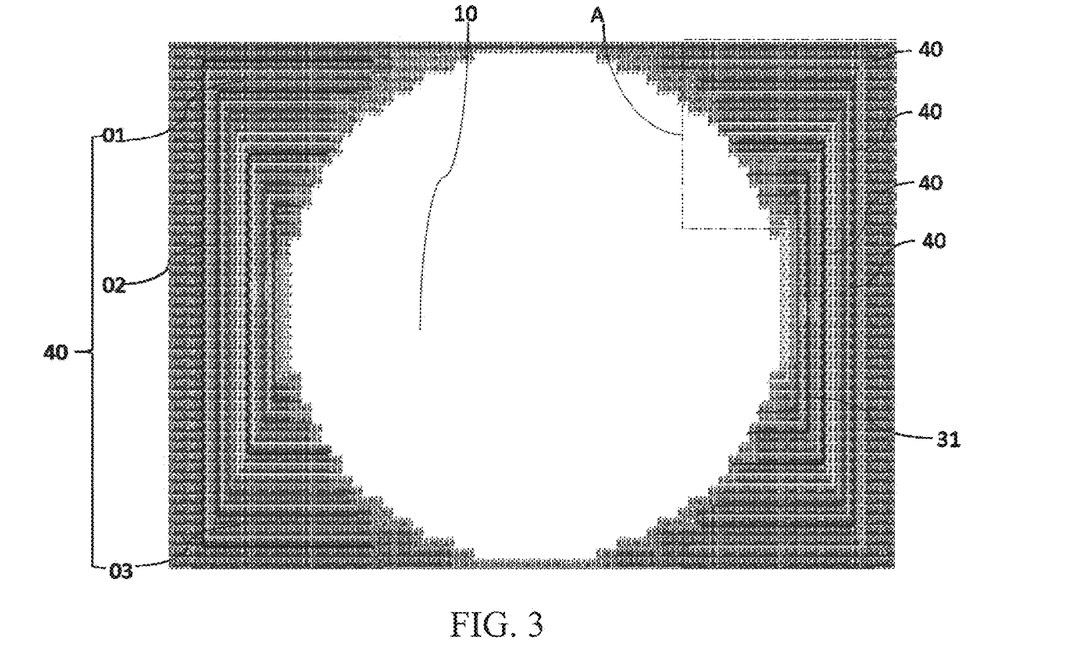
FIG. 3 is a schematic plan view of data connection lines provided by an embodiment of the present disclosure.
Figure 4:
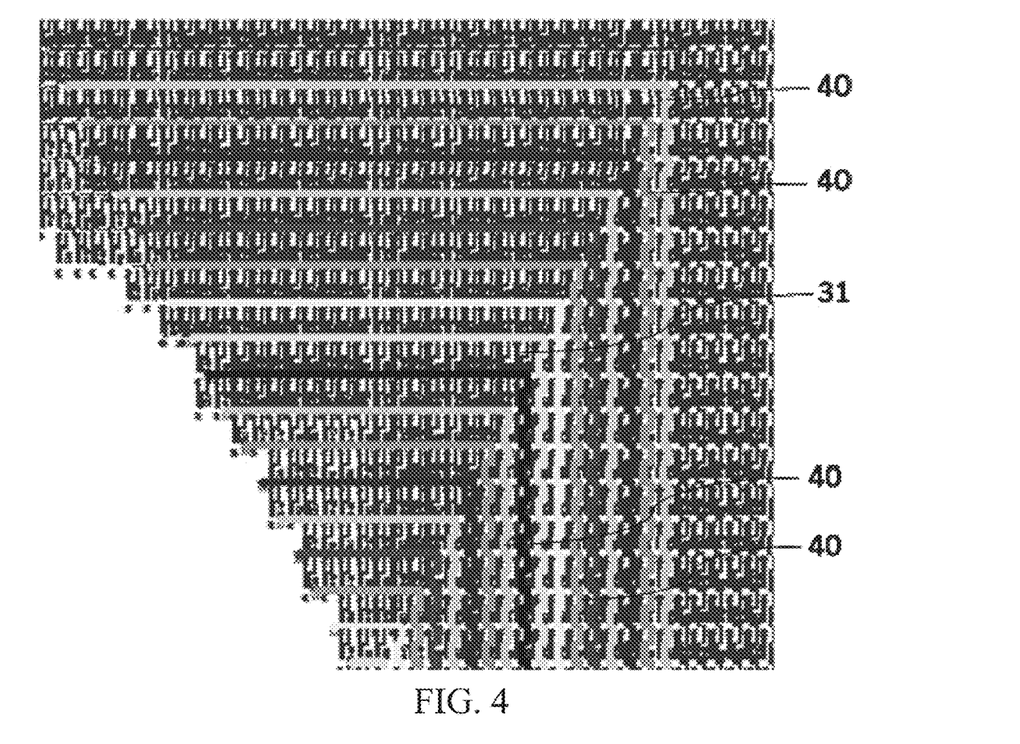
FIG. 4 is a partial enlarged view of the A place in FIG. 3.

FIG. 3 is a schematic plan view of the data connection line provided by the embodiment of the present disclosure. FIG. 4 is a partial enlarged view of the A place in FIG. 3. As shown in FIG. 3 and FIG. 4, the first display area 31 is provided with a plurality of data connection lines 40, and each of the data connection lines 40 is connected with two data lines extending in a same direction and located on both sides of the aperture area 10. Specifically, each of the data connection lines 40 is used to connect the data lines respectively on an upper side and a lower side of the aperture area 10 shown in FIG. 2, so as to realize the overlapping of the data lines on both sides of the aperture area 10, and ensure the normal transmission of data signals. In addition, since the data connection lines 40 are disposed in the display area 30, a width of the transition area 20 can be reduced, and the display effect of a narrow frame can be achieved.

Refer to FIG. 3. Each of the data connection lines 40 includes a first fold line part 01, a second fold line part 02, and a third fold line part 03 connected in sequence, and the second fold line part 02 is respectively perpendicular to the first fold line part 01 and the third fold line part 03. One end of the first fold line part 01 is electrically connected to the data line on one side of the aperture area 10, and the other end of the first fold line part 01 is electrically connected to one end of second fold line part 02. One end of the third fold line part 03 is electrically connected to the data line on the other side of the aperture area 10, and the other end of the third fold line part 03 is electrically connected to the other end of the second fold line part 02.

Figure 5:
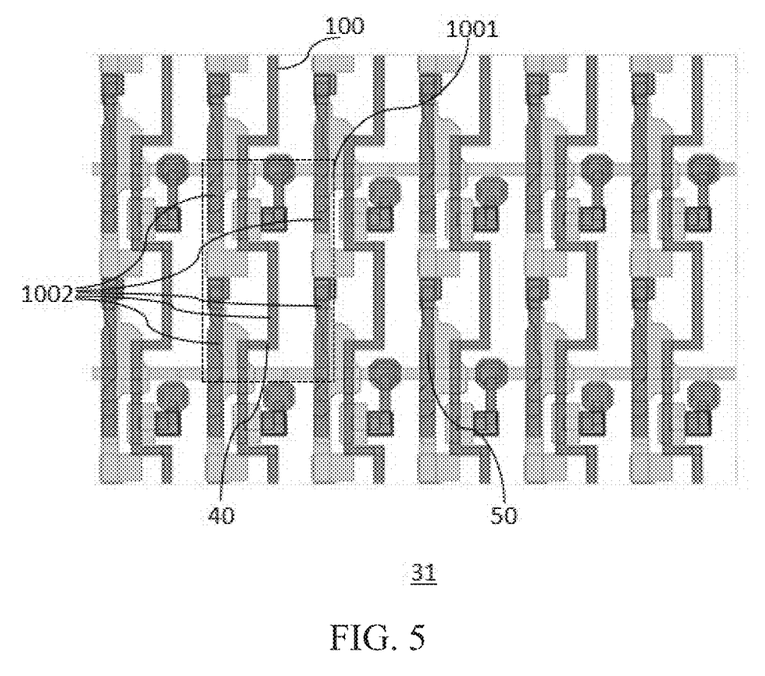
FIG. 5 is a partial schematic view of a first display area provided by an embodiment of the present disclosure.

It can be seen from FIG. 3 and FIG. 4 that the data connection lines 40 located in the first display area 31 are arranged in an orderly manner according to a certain rule. FIG. 5 is a partial schematic view of the first display area provided by an embodiment of the present disclosure. Refer to FIG. 5, in order to avoid the diffraction grating phenomenon caused by the data connection lines 40 arranged in an orderly manner, and reduce the probability of the mura problem of the display panel in a screen-on state, in the display panel of the present disclosure, the first display area 31 is further provided with a plurality of first dummy conductive patterns 50, wherein the plurality of first dummy conductive patterns 50 are evenly disposed in the gap area between adjacent data connection lines 40. In the present disclosure, the plurality of first dummy conductive patterns 50 are evenly disposed in the gap area between adjacent data connection lines 40, so that slits between adjacent data connection lines 40 are irregular, so as to reduce an area of the slit, thereby reducing diffraction grating phenomenon caused by a regular arrangement of the data connection lines 40, and reducing the probability of the mura problem of the display panel in a screen-on state, so as to improve the display quality.

Figure 6:
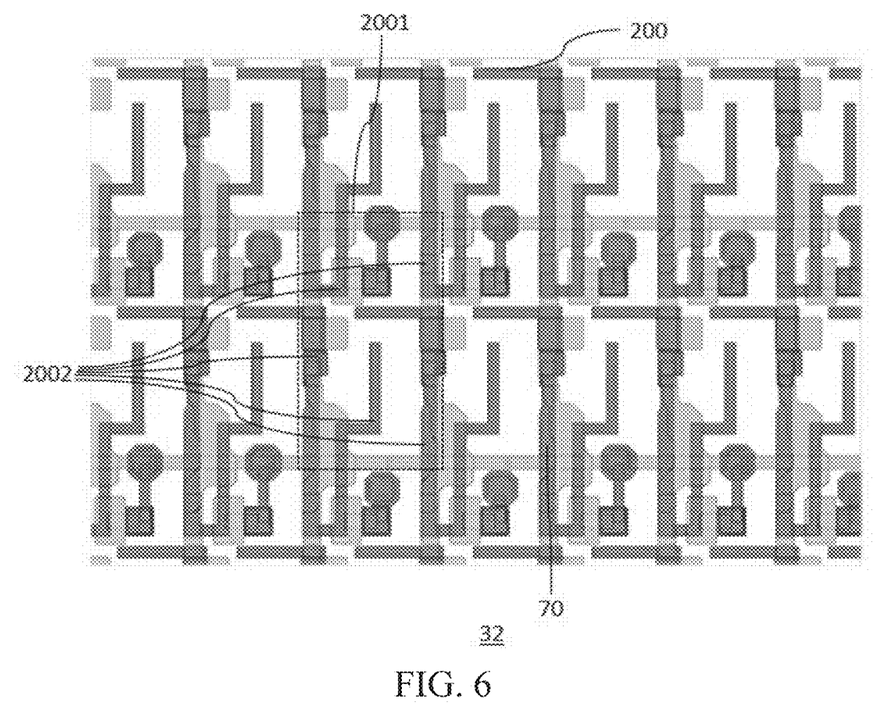
FIG. 6 is a partial schematic view of a second display area provided by an embodiment of the present disclosure.

In addition, it can be seen from the above content that the first display area 31 is provided with the data connection lines 40 and the first dummy conductive patterns 50. During the panel design, when the pattern design of the first display area 31 and the second display area 32 are inconsistent and a density difference between the first display area 31 and the second display area 32 is large, the mura problem of the display panel in a screen-off state is likely to occur. FIG. 6 is a partial schematic view of the second display area 32 provided by an embodiment of the present disclosure. Refer to FIG. 6, in order to solve the mura problem of the display panel in the screen-off state, in the display panel provided by the present disclosure, the second display area 32 is further provided with second dummy conductive patterns 70.

Refer to FIG. 5 and FIG. 6. Specifically, the first display area 31 includes a plurality of first pixel areas 1001 arranged in an array. In the first display area 31, a first combined pattern 100 formed by each of the data connection lines 40 and each of the first dummy conductive patterns 50 is defined by each of the first pixel areas 1001 to form a plurality of first sub-patterns 1002. Each of the first sub-patterns 1002 is composed of four parts of four of the first dummy conductive patterns 50 and a part of one of the data connection lines 40 together. The second display area 32 includes a plurality of second pixel areas 2001 arranged in an array, and the display panel further includes a plurality of second dummy conductive patterns 70 arranged in an array in the second display area 32. A second combined pattern 200 formed by each of the second dummy conductive patterns 70 is defined by each of the second pixel areas 2001 to form a plurality of second sub-patterns 2002. Each of the second sub-patterns 2002 is composed of five parts of four of the second dummy conductive patterns 70 together. Each of the second pixel areas 2001 is defined by intersection of two adjacent ones of the data lines and two adjacent scan lines. A shape and an area of the first pixel area 1001 are the same as those of the second pixel area 2001, and a pattern similarity between the first sub-pattern 1002 and the second sub-pattern 2002 is greater than or equal to 70%. In the present disclosure, the second dummy conductive patterns 70 are disposed in the second display area 32, and one pixel area is taken as a unit, so that the similarity between the first sub-pattern 1002 in the first pixel area 1001 and the second sub-pattern 2002 in the second pixel area 2001 is greater than or equal to 70%, and the similarity between the second combined pattern 200 of the second display area 32 and the first combined pattern 100 of the first display area 31 can be improved and tend to be consistent, thereby improving the mura problem of the display panel in the screen-off state. Specifically, the pattern similarity between the first sub-pattern 1002 and the second sub-pattern 2002 means that a ratio of an area of the overlapping portion of the first sub-pattern 1002 and the second sub-pattern 2002 to the area of the first sub-pattern 1002 when the first pixel area 1001 completely overlaps the second pixel area 2001.

Figure 7:
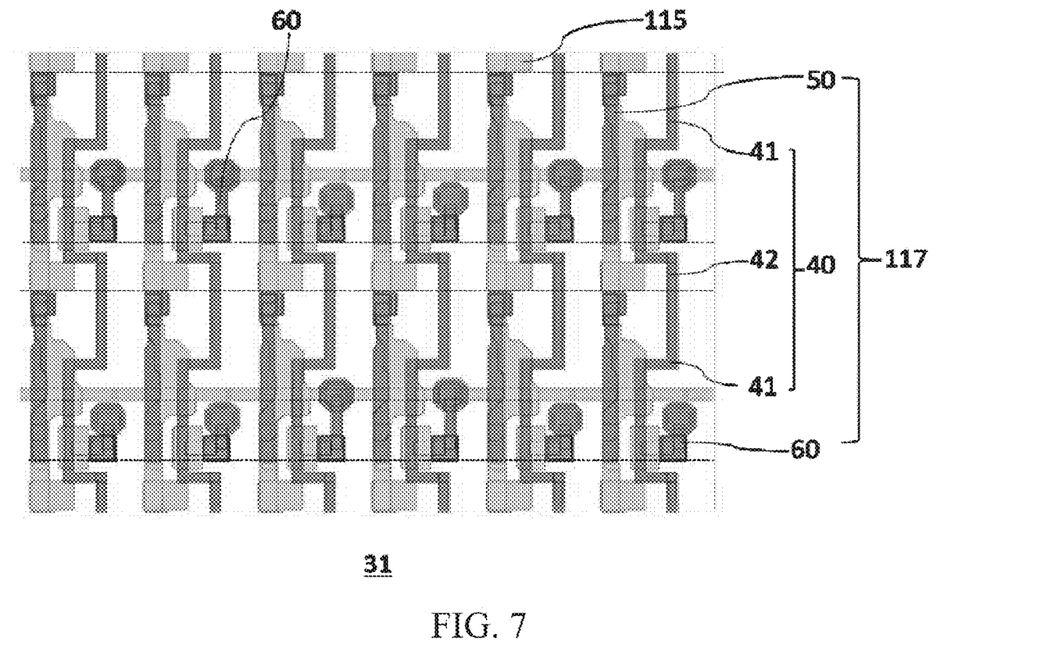
FIG. 7 is another partial schematic view of a first display area provided by an embodiment of the present disclosure.
Figure 8:
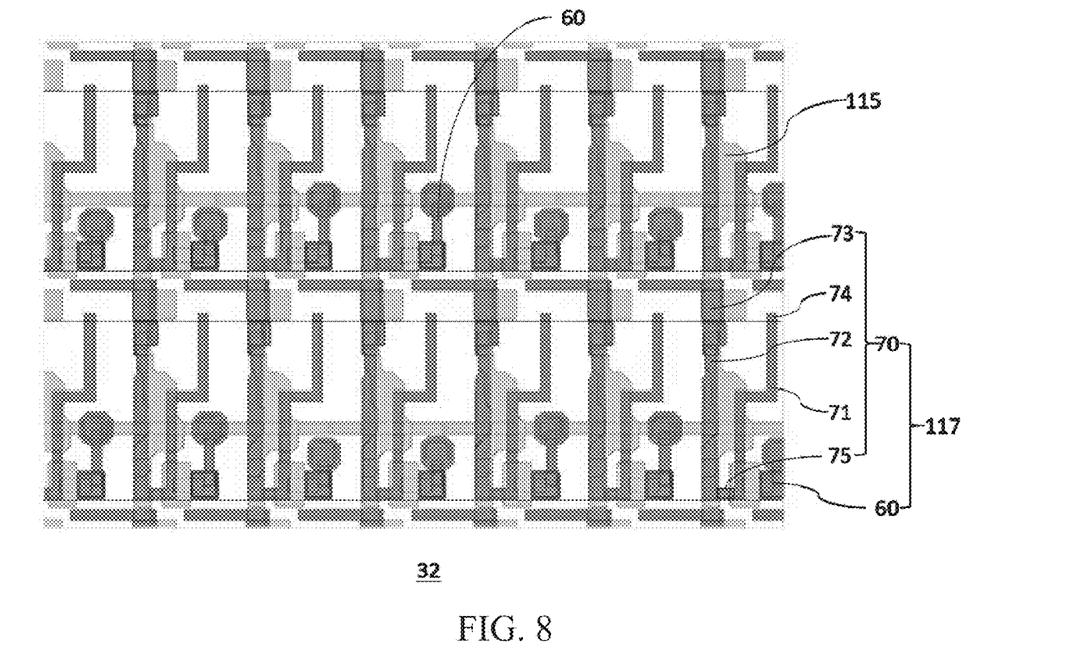
FIG. 8 is another partial schematic view of a second display area provided by an embodiment of the present disclosure.

Further, FIG. 7 is another partial schematic view of the first display area provided by an embodiment of the present disclosure, and FIG. 8 is another partial schematic view of the second display area provided by an embodiment of the present disclosure. As shown in FIGS. 5-8, the data connection line 40 includes a plurality of first units 41 and a plurality of second units 42, two adjacent ones of the first units 41 are connected through one of the second units 42, and a length of the first units 41 in a data line extension direction is the same as that of the first dummy conductive patterns 50 in the data line extension direction. The second dummy conductive pattern 70 includes a first part 71 and a second part 72, wherein the first part 71 has the same shape as the first unit 41, and the second part 72 has the same shape as the first dummy conductive pattern 50. Further, an area of the first part 71 is the same as that of the first unit 41, and an area of the second part 72 is the same as that of the first dummy conductive pattern 50. Since the shape and area of the first part 71 and the first unit 41 are the same, and the shape and area of the second part 72 and the first dummy conductive pattern 50 are the same, the similarity between the second combined pattern 200 of the second display area 32 and the first combined pattern 100 of the first display area 31 can be improved and tend to be consistent, thereby improving the mura problem of the display panel in the screen-off state.

In the embodiment, each of the first dummy conductive patterns 50 has a first voltage, and each of the second dummy conductive patterns 70 has a second voltage. The first voltage is equal to the second voltage. Specifically, the first dummy conductive patterns 50 are disposed in an array in the gap area between the adjacent data connection lines 40 in the first display area 31, and the plurality of second dummy conductive patterns 70 are disposed in an array in the second display area 32. The first dummy conductive patterns 50 and the second dummy conductive patterns 70 are both conductive. In circuit design, a problem of electrostatic explosion is prone to occur in a design of a large area floating dummy conductive pattern. In order to solve this problem, in the present disclosure, the first dummy conductive patterns 50 and the second dummy conductive patterns 70 are electrically connected to a voltage terminal, so that the voltage on each of the first dummy conductive patterns 50 is equal to the voltage on each of the second dummy conductive patterns 70, so as to play the role of electrostatic protection.

In the embodiment, the display panel further includes a VDD signal line, and each of the first dummy conductive patterns 50 and each of the second dummy conductive patterns 70 are electrically connected to the VDD signal line, so that each of the first dummy conductive pattern 50 and each of the second dummy conductive patterns 70 have the same voltage.

In the embodiment, the first dummy conductive patterns 50 and the second dummy conductive patterns 70 are disposed on the same layer as the data connection lines 40, so that the first dummy conductive patterns 50, the second dummy conductive patterns 70, and the data connection lines 40 can be formed by a single film forming process, thereby reducing the manufacturing cost of the display panel.

Figure 9:
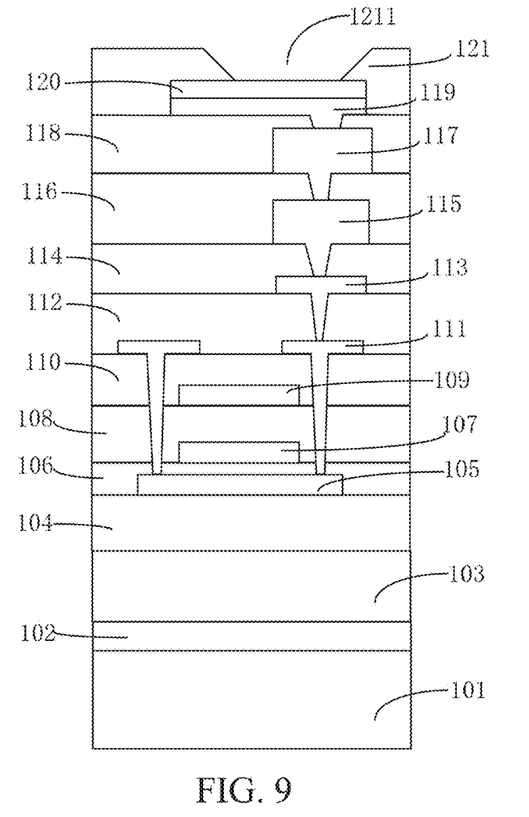
FIG. 9 is a schematic view of film layer structures of a display area of a display panel provided by an embodiment of the present disclosure.

The film layer structures of the display panel are further described below. FIG. 9 is a schematic view of the film layer structures of the display area of the display panel provided by an embodiment of the present disclosure. Refer to FIG. 9, the display panel includes: a first substrate 101, a first buffer layer 102, a second substrate 103, a second buffer layer 104, an active layer 105, a first gate insulating layer 106, a first gate layer 107, a second gate insulating layer 108, a second gate layer 109, an interlayer insulating layer 110, a first source drain layer 111, a first planarization layer 112, a second source drain layer 113, a second planarization layer 114, a second transparent conductive layer 115, a third planarization layer 116, a first transparent conductive layer 117, a fourth planarization layer 118, a third transparent conductive layer 119, an anode layer 120, and a pixel definition layer 121. The pixel definition layer 121 is formed with a plurality of pixel definition openings 1211. The first dummy conductive patterns 50, the second dummy conductive patterns 70 and the data connection lines 40 are formed by patterning the first transparent conductive layer 117.

Figure 10:
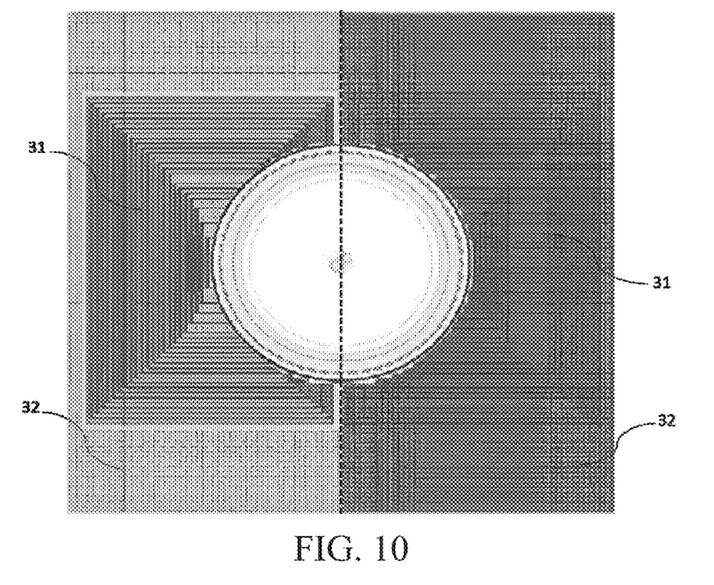
FIG. 10 is a schematic plan view of first transparent conductive layers in display areas of the prior art (left) and the present disclosure (right).

FIG. 10 is a schematic plan view of a first transparent conductive layer in the display area of the prior art (left) and that of the present disclosure (right). As shown in FIGS. 7-10, in the first display area 31, the first transparent conductive layer 117 of the present disclosure includes the data connection lines 40 and the first dummy conductive patterns 50. By configuring the first dummy conductive patterns 50 in the gap area between two adjacent ones of the data connection lines 40 in the first display area 31, the area of the slit between two adjacent ones of the data connection lines 40 can be effectively reduced, so as to eliminate or reduce the problem of diffraction grating caused by the slit formed by the regular trace of the data connection lines 40. In the second display area 32, the first transparent conductive layer 117 of the present disclosure includes the second dummy conductive patterns 70. The second dummy conductive pattern includes a first part 71, a second part 72, a third part 73, a fourth part 74, and a fifth part 75. One end of the first part 71 is connected with one end of the fourth part 74, and one end of the second part 72 is connected with one end of the third part 73. Two ends of the fifth part 75 are respectively connected with the other end of the first part 71 and the other end of the second part 72. A shape and an area of the first part 71 are the same as those of the first unit 41, and a shape and an area of the second part 72 are the same as those of the first dummy conductive pattern 50. Therefore, the similarity of the pattern design of the first transparent conductive layer 117 in the first display area 31 and the second display area 32 can be improved, and tend to be consistent, so that the mura problem of the display panel in a screen-off state can be improved.

Refer to FIGS. 7 to 10. In the embodiment, a plurality of thin film transistors and a plurality of pixel units are disposed in an array in the display area 30. Specifically, the thin film transistor is, for example, a double gate thin film transistor. A active layer 105 is used to form the channel region, source region and drain region of the thin film transistor. The first gate layer 107 and the second gate layer 109 are used to form the first gate and the second gate of the thin film transistor respectively. The first source drain layer 111 is used to form the source and drain of the thin film transistor. The pixel unit includes an anode electrically connected with the drain of the thin film transistor, an organic light-emitting layer covering the anode layer 120, and a cathode covering the organic light-emitting layer. The anode layer 120 is used to form the anode. It should be noted that in different display panel structures, since the source and drain, anode and cathode can be converted to each other in some cases, the anode can further be replaced by the cathode and the drain can further be replaced by the anode in the present disclosure.

In the embodiment, the thin film transistor is located under the first transparent conductive layer 117, and the pixel units are located on the first transparent conductive layer 117. The first transparent conductive layer 117 further includes a plurality of switching wires 60 located on the first display area 31 and the second display area 32, and the switching wires 60 are respectively electrically connected to the anode and the drain through via holes. The first dummy conductive patterns and the second dummy conductive patterns are both disposed at intervals from the switching wires.

In the embodiment, in the first display area 31, a minimum distance between the first dummy conductive pattern 50 and the adjacent switching wire 60 is greater than or equal to 3 µm. A minimum distance between the first dummy conductive pattern 50 and the adjacent data connection line 40 is greater than or equal to 3 µm. Such structure can reduce a load of the VDD signal line electrically connected to the first transparent conductive layer 117, and reduce the static electricity generated by an arrangement of the first dummy conductive pattern 50, thereby reducing the risk of electrostatic explosion. Further, the minimum distance between the first dummy conductive pattern 50 and the adjacent switching wire 60 is equal to the minimum distance between the first dummy conductive pattern 50 and the adjacent data connection line 40.

In the embodiment, the structure of the switching wire 60 of the first display area 31 is the same as that of the switching wire 60 of the second display area 32. The switching wire 60 of the first display area 31 includes a first switching wire and a second switching wire. Correspondingly, the second display area 32 also includes the first switching wire and second switching wire with the same structural design.

In the embodiment, the second transparent conductive layer is located between the thin film transistor and the first transparent conductive layer 117, wherein the first transparent conductive layer 117 includes a patterned structure electrically connected to the VDD signal line, and the first dummy conductive patterns 50 and the second dummy conductive patterns 70 are respectively electrically connected to the patterned structure through via holes. That is, the patterned structure is the same as the electrical signals accessed by the first dummy conductive pattern 50 and the second dummy conductive pattern 70. The patterned structure in the second transparent conductive layer 115 can act as a shielding electrode to prevent crosstalk between the first transparent conductive layer 117 and the electrode or wiring under the patterned structure from affecting the display quality.

On the other hand, the present disclosure further provides a display device, and the display device includes an optical element and the display panel according to any one of the above. The display panel includes a display side and a non-display side, and the optical element is disposed on the non-display side of the display panel corresponding to the aperture area 10.

In summary, the present disclosure provides a display panel and a display device. The display panel comprises an aperture area and a display area surrounding the aperture area. The display area includes a first display area and a second display area surrounding the first display area. The first display area is provided with a plurality of data connection lines, and each of the data connection lines is connected to two data lines extending along a same direction and located on both sides of the aperture area. The first display area is further provided with a plurality of first dummy conductive patterns, and the plurality of first dummy conductive patterns are evenly distributed in a gap area between two adjacent ones of the data connection lines. In the present disclosure, the plurality of first dummy conductive patterns are evenly disposed in the gap area between adjacent data connection lines, so that slits between adjacent data connection lines are irregular, so as to reduce an area of the slit, thereby reducing diffraction grating phenomenon caused by a regular arrangement of the data connection lines, and reducing the probability of the mura problem of the display panel in a screen-on state, so as to improve the display quality.

A display panel and a display device provided by the embodiments of the present disclosure have been described in detail above, and the principles and implementations of the present disclosure are described with specific embodiments. The descriptions of the above embodiments are merely used to help understand the method of the present disclosure and core idea thereof. Moreover, for those skilled in the art, according to the idea of the present disclosure, there are modifications in the specific embodiments and disclosure scope. In summary, the content of the present disclosure should not be construed as a limitation to the present disclosure.

What is claimed is:

1. A display panel, comprising: an aperture area and a display area surrounding the aperture area,
    wherein the display area includes a first display area surrounding the aperture area and a second display area surrounding the first display area, the first display area is provided with a plurality of data connection lines, and each of the data connection lines is connected to two data lines extending along a same direction and located on both sides of the aperture area;
    wherein the plurality of data connection lines extend along an extending direction thereof in parallel and are spaced apart from each other by a predetermined distance in a first direction different from the extending direction of the data connection lines;
    wherein the first display area is further provided with a plurality of first dummy conductive patterns, and at least two of the plurality of first dummy conductive patterns are spaced apart from each other by a predetermined distance in the extending direction of the data connection lines between two ones of the data connection lines adjacent with each other in the first direction in the first display area; and
    wherein each of the data connection lines comprises a linear portion and a bent portion arranged alternately, the linear portion extends linearly along an extending direction thereof, the bent portion bends from the linear portion toward a second direction different from the extension direction of the linear portion and has an n-shape, the first dummy conductive pattern are at one of both sides of the linear portion in the second direction and extends in a linear shape and in parallel with the linear portion of the data connection line, until overlapping with the bent portion of the data connection line in the second direction, and the first dummy conductive pattern and the data line are in the same layer but have different shape from each other.

2. The display panel of claim 1, wherein the first display area includes a plurality of first pixel areas disposed in an array, and a first combined pattern formed by each of the data connection lines and each of the first dummy conductive patterns is defined by each of the first pixel areas to form a plurality of first sub-patterns;
    wherein the second display area includes a plurality of second pixel areas disposed in an array, the display panel further comprises a plurality of second dummy conductive patterns disposed in an array in the second display area, and a second combined pattern formed by each of the second dummy conductive patterns is defined by each of the second pixel areas to form a plurality of second sub-patterns; wherein each of the second pixel areas is defined by intersection of two adjacent ones of the data lines and two adjacent scan lines, a shape and an area of the first pixel area are the same as a shape and an area of the second pixel area, and a pattern similarity between the first sub-pattern and the second sub-pattern is greater than or equal to 70%.

3. The display panel of claim 2, wherein each of the first dummy conductive patterns has a first voltage, each of the second dummy conductive patterns has a second voltage, and the first voltage is equal to the second voltage.

4. The display panel of claim 3, wherein the display panel further comprises a VDD signal line, and each of the first dummy conductive patterns and each of the second dummy conductive patterns are both electrically connected to the VDD signal line.

5. The display panel of claim 4, wherein the first dummy conductive patterns and the second dummy conductive patterns are disposed on the same layer as the data connection lines.

6. The display panel of claim 5, wherein the display area is provided with a first transparent conductive layer, and the first dummy conductive patterns, the second dummy conductive patterns, and the data connection lines are formed by patterning the first transparent conductive layer.

7. The display panel of claim 6, wherein a plurality of thin film transistors and a plurality of pixel units are disposed in an array in the display area, the plurality of thin film transistors are located under the first transparent conductive layer and include a source and a drain; and the plurality of pixel units are located on the first transparent conductive layer and include an anode;
wherein the first transparent conductive layer further includes a plurality of switching wires located in the first display area and the second display area, and the switching wires are respectively electrically connected to the anode and the drain through via holes; wherein the first dummy conductive patterns and the second dummy conductive patterns are both disposed at intervals from the switching wires.

8. The display panel of claim 7, wherein in the first display area, a minimum distance between each of the first dummy conductive patterns and the adjacent switching wires is greater than or equal to 3 μm, and a minimum distance between each of the first dummy conductive patterns and the adjacent data connection lines is greater than or equal to 3 μm.

9. The display panel of claim 6, wherein the display area is further provided with a second transparent conductive layer, and the second transparent conductive layer is located between the thin film transistor and the first transparent conductive layer, wherein the second transparent conductive layer includes a patterned structure electrically connected to the VDD signal line, and the first dummy conductive patterns and the second dummy conductive patterns are respectively electrically connected to the patterned structure through via holes.

10. The display panel of claim 1, wherein each of the data connection lines includes a first fold line part, a second fold line part, and a third fold line part which are connected in sequence, and the second fold line part is respectively perpendicular to the first fold line part and the third fold line part.

11. A display device, comprising: an optical element and a display panel, wherein the display panel comprises an aperture area and a display area surrounding the aperture area, and the display area includes: a first display area surrounding the aperture area and a second display area surrounding the first display area, the first display area is provided with a plurality of data connection lines, and each of the data connection lines is connected to two data lines extending along a same direction and located on both sides of the aperture area;
wherein the plurality of data connection lines extend along an extending direction thereof in parallel and are spaced apart from each other by a predetermined distance in a first direction different from the extending direction of the data connection lines;
wherein the first display area is further provided with a plurality of first dummy conductive patterns, and at least two of the plurality of first dummy conductive patterns are spaced apart from each other by a predetermined distance in the extending direction of the data connection lines between two ones of the data connection lines adjacent with each other in the first direction in the first display area; and
wherein each of the data connection lines comprises a linear portion and a bent portion arranged alternately, the linear portion extends linearly along an extending direction thereof, the bent portion bends from the linear portion toward a second direction different from the extension direction of the linear portion and has an n-shape, the first dummy conductive pattern are at one of both sides of the linear portion in the second direction and extends in a linear shape and in parallel with the linear portion of the data connection line, until overlapping with the bent portion of the data connection line in the second direction, and the first dummy conductive pattern and the data line are in the same layer but have different shape from each other;
wherein the display panel comprises a display side and a non-display side, and the optical element is disposed on the non-display side of the display panel, and is disposed corresponding to the aperture area.

12. The display panel of claim 11, wherein the first display area includes a plurality of first pixel areas disposed in an array, and a first combined pattern formed by each of the data connection lines and each of the first dummy conductive patterns is defined by each of the first pixel areas to form a plurality of first sub-patterns;
wherein the second display area includes a plurality of second pixel areas disposed in an array, the display panel further comprises a plurality of second dummy conductive patterns disposed in an array in the second display area, and a second combined pattern formed by each of the second dummy conductive patterns is defined by each of the second pixel areas to form a plurality of second sub-patterns; wherein each of the second pixel areas is defined by intersection of two adjacent ones of the data lines and two adjacent scan lines, a shape and an area of the first pixel area are the same as a shape and an area of the second pixel area, and a pattern similarity between the first sub-pattern and the second sub-pattern is greater than or equal to 70%.

13. The display panel of claim 12, wherein each of the first dummy conductive patterns has a first voltage, each of the second dummy conductive patterns has a second voltage, and the first voltage is equal to the second voltage.

14. The display panel of claim 13, wherein the display panel further comprises a VDD signal line, and each of the first dummy conductive patterns and each of the second dummy conductive patterns are both electrically connected to the VDD signal line.

15. The display panel of claim 14, wherein the first dummy conductive patterns and the second dummy conductive patterns are disposed on the same layer as the data connection lines.

16. The display panel of claim 15, wherein the display area is provided with a first transparent conductive layer, and the first dummy conductive patterns, the second dummy conductive patterns, and the data connection lines are formed by patterning the first transparent conductive layer.

17. The display panel of claim 16, wherein a plurality of thin film transistors and a plurality of pixel units are disposed in an array in the display area, the plurality of thin film transistors are located under the first transparent conductive layer and include a source and a drain; and the plurality of pixel units are located on the first transparent conductive layer and include an anode;

wherein the first transparent conductive layer further includes a plurality of switching wires located in the first display area and the second display area, and the switching wires are respectively electrically connected to the anode and the drain through via holes; wherein the first dummy conductive patterns and the second dummy conductive patterns are both disposed at intervals from the switching wires.

18. The display panel of claim 16, wherein the display area is further provided with a second transparent conductive layer, and the second transparent conductive layer is located between the thin film transistor and the first transparent conductive layer, wherein the second transparent conductive layer includes a patterned structure electrically connected to the VDD signal line, and the first dummy conductive patterns and the second dummy conductive patterns are respectively electrically connected to the patterned structure through via holes.

19. The display panel of claim 11, wherein each of the data connection lines includes a first fold line part, a second fold line part, and a third fold line part which are connected in sequence, and the second fold line part is respectively perpendicular to the first fold line part and the third fold line part.

20. The display panel of claim 17, wherein in the first display area, a minimum distance between each of the first dummy conductive patterns and the adjacent switching wires is greater than or equal to 3 µm, a minimum distance between each of the first dummy conductive patterns and the adjacent data connection lines is greater than or equal to 3 µm, each of the switching wires overlaps with the bent portion and the first dummy conductive pattern in the second direction, and the first direction is same as the second direction.

* * * * *